US008210357B2

(12) United States Patent
Masuda et al.

(10) Patent No.: US 8,210,357 B2
(45) Date of Patent: Jul. 3, 2012

(54) TAPED COMPONENT AND METHOD OF MOUNTING PRODUCT USING THE SAME

(75) Inventors: Masahiro Masuda, Osaka (JP); Yasunori Yanai, Osaka (JP); Yoshikazu Yagi, Osaka (JP)

(73) Assignee: Panasonic Corporation, Osaka (JP)

( * ) Notice: Subject to any disclaimer, the term of this patent is extended or adjusted under 35 U.S.C. 154(b) by 1217 days.

(21) Appl. No.: 11/969,249

(22) Filed: Jan. 4, 2008

(65) Prior Publication Data

US 2008/0220208 A1   Sep. 11, 2008

(30) Foreign Application Priority Data

Mar. 8, 2007   (JP) ................. 2007-058044

(51) Int. Cl.
*B32B 3/10* (2006.01)
*H05K 3/30* (2006.01)
*H05K 13/02* (2006.01)
*B65D 85/86* (2006.01)
*B65D 73/02* (2006.01)

(52) U.S. Cl. ........ 206/714; 206/713; 428/131; 428/137; 428/156; 428/172

(58) Field of Classification Search ............. 206/728, 206/714, 713, 725, 390, 345
See application file for complete search history.

(56) References Cited

U.S. PATENT DOCUMENTS

| 3,027,004 | A | * | 3/1962 | Gluck | 206/716 |
| 4,633,370 | A | * | 12/1986 | Hamuro et al. | 361/679.01 |
| 4,702,370 | A | * | 10/1987 | Honda | 206/714 |
| 4,757,895 | A | * | 7/1988 | Gelzer | 206/479 |
| 5,076,427 | A | * | 12/1991 | Thomson et al. | 206/714 |
| 5,119,934 | A | * | 6/1992 | Karasawa et al. | 206/714 |
| 5,339,939 | A | * | 8/1994 | Gueble et al. | 198/345.2 |
| 5,361,901 | A | * | 11/1994 | Schenz et al. | 206/714 |
| 5,690,233 | A | * | 11/1997 | Kaneko | 206/714 |
| 5,992,639 | A | * | 11/1999 | Naito et al. | 206/714 |
| 6,047,832 | A | * | 4/2000 | Raschke | 206/714 |
| 6,168,026 | B1 | * | 1/2001 | Haggard et al. | 206/714 |
| 6,892,886 | B2 | * | 5/2005 | Khoo et al. | 206/714 |
| 6,945,406 | B2 | * | 9/2005 | Song et al. | 206/714 |
| 7,395,932 | B2 | * | 7/2008 | Chew et al. | 206/714 |

FOREIGN PATENT DOCUMENTS

| JP | 01070370 A | * | 3/1989 |
| JP | 01258499 A | * | 10/1989 |
| JP | 04-064290 A | | 2/1992 |
| JP | 2000223891 A | * | 8/2000 |
| JP | 2003-026229 | | 1/2003 |

OTHER PUBLICATIONS

English Abstract of JP 01-258499 A, Oct. 1989.*
English Translation of JP 01-258499 A, Oct. 1989.*

* cited by examiner

*Primary Examiner* — David R Sample
*Assistant Examiner* — Jeff Vonch
(74) *Attorney, Agent, or Firm* — Pearne & Gordon LLP

(57) ABSTRACT

A taped component includes a career tape having an upper surface having recesses provided therein, and products stored in the recesses, respectively. Each of the recesses has a bottom on which each of the products is placed. The bottom has an aperture provided therein, and the aperture faces a position different from the center of gravity of each of the products. This taped component allows the product to be mounted efficiently.

6 Claims, 12 Drawing Sheets

PRIOR ART

PRIOR ART

PRIOR ART

PRIOR ART

TAPED COMPONENT AND METHOD OF MOUNTING PRODUCT USING THE SAME

FIELD OF THE INVENTION

The present invention relates to a taped component including a career tape containing a product, such as an electronic component used for an electronic apparatus, and relates to a method of mounting the product.

BACKGROUND OF THE INVENTION

Automated mounting machines for mounting products have been recently used when assembling various electronic apparatuses. A large number of taped components containing plural products are used for automatic mounting. The taped component includes a career tape made of plastic. The carrier tape has plural recesses arranged at constant intervals and formed by embossing process. The recesses store products, respectively, and are sealed with a cover tape.

FIG. 12 is a plan view of conventional taped component 501. FIG. 13 is a sectioned view of taped component 501. FIG. 14 is a plan view of career tape 1 of taped component 501. Career tape 1 made of plastic has plural recesses 11 provided therein at constant intervals. Product 20 is stored in each of recesses 11. Cover tape 5 is adhered to an upper surface of career tape 1 to cover and seal recesses 11.

FIG. 15 is a perspective view of product 20. Product 20 is a push switch including case 21 having substantially a thin cuboid shape. Push switch elements are accommodated in each of both sides of case 21. Flexible insulation film 23 is placed on a front surface of case 21 at a position where each of the switch elements is accommodated. Terminals 25 connected with these switch elements extend downward from a bottom portion at a center area of case 21.

In description below, a surface of case 21 having flexible insulation films 23 placed thereon is defined as a front surface of product 20, a surface opposite to the front surface is a back surface, and a direction in which terminals 25 projects from case 21 is a downward direction.

Terminal 25 is made of thin metal plate having elasticity, and projects downward from case 21. Terminal 25 has first bent portion 26 formed by being bent frontward and second bent portion 27 formed by being bent upward at a tip of first bent portion 26. A surface of second bent portion 27 facing downward is pressed to contact a wiring pattern to electrically connect product 20.

In conventional taped component 501, product 20 is stored such that the front surface of case 21 having flexible insulation films 23 placed thereon faces towards an opening of recess 11 of career tape 1, and the back surface is mounted onto a bottom of recess 11, as shown in FIGS. 12 and 13.

A method of taking out product 20 from conventional taped component 501 and mounting product 20 will be described. FIGS. 16 to 19 are perspective views of taped component 501 for illustrating the method of mounting product 20.

Cover tape 5 is removed from career tape 1, and then product 20 is retained by sucking the center of the front surface of case 21 with suction chuck 30, as shown in FIG. 16. Product 20 is taken out from recess 11 of career tape 1 while sucking and holding the center of the front surface of case 21 with suction chuck 30.

Then, retaining chuck 32 approaches to product 20 from the surface of case 21 from which terminal 25 projects while the center of the front surface of case 21 is sucked and held with suction chuck 30, as shown in FIG. 17. Retaining chuck 32 includes retainer 32C including movable section 32A and fixed section 32B facing each other. Retaining chuck 32 retains product 20 by holding case 21 with movable section 32A and fixed section 32B from the surface from which terminal 25 projects. Suction chuck 30 is moved away from product 20 when retaining chuck 32 holds case 21.

Then, mounting tool 35 having engage portions 35A having shapes approximating the shape of case 21 of product 20 is prepared, as shown in FIG. 18. Product 20 retained by retaining chuck 32 is engaged in engage portions 35A of mounting tool 35 from the upper side of case 21. Then, retaining chuck 32 releases product 20. This allows product 20 to be engaged in mounting tool 35, as shown in FIG. 19. Then, mounting tool 35 is positioned and held with a case of an electronic apparatus, and presses product 20 and causes terminal 25 to contact wiring pattern on a wiring board located inside the case, thus mounting product 20 into the electronic apparatus.

In conventional taped component 501, terminal 25 extends horizontally within recess 11 when product 20 is stored in recess 11 of career tape 1. Therefore, product 20 cannot be mounted onto the wiring board just after being taken out with suction chuck 30 from recess 11 of career tape 1 since terminal 25 is directed horizontally. In order to press terminal 25 to contact the wiring pattern, product 20 is engaged into mounting tool 35, and then, mounting tool 35 is positioned. Thus, product 20 is necessarily retained with retaining chuck 32 after being sucked with suction chuck 30, thus requiring a lot of processes to mount product 20.

SUMMARY OF THE INVENTION

A taped component includes a career tape having an upper surface having recesses provided therein, and products stored in the recesses, respectively. Each of the recesses has a bottom on which each of the products is placed. The bottom has an aperture provided therein, and the aperture faces a position different from the center of gravity of each of the products.

This taped component allows the product to be mounted efficiently.

DESCRIPTION OF THE PREFERRED EMBODIMENT

Figure 1:
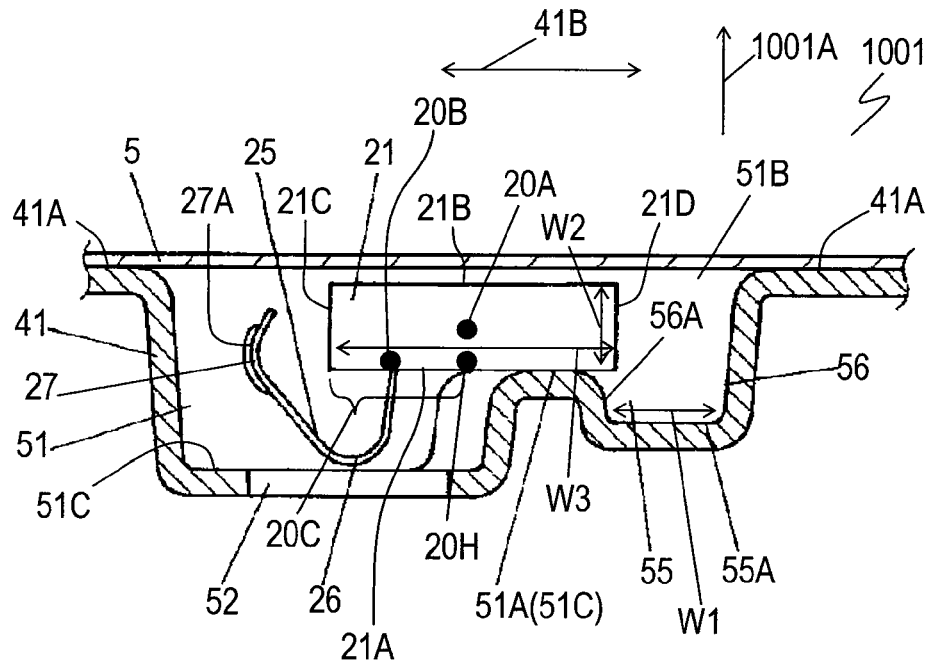
FIG. 1 is a sectioned view of a taped component according to an exemplary embodiment of the present invention.
Figure 2:
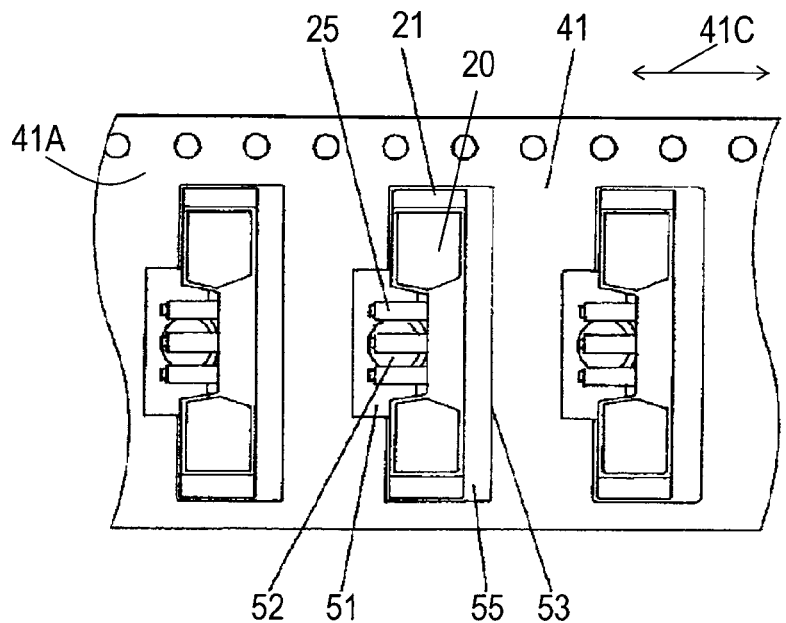
FIG. 2 is a plan view of the taped component according to the embodiment.
Figure 4:
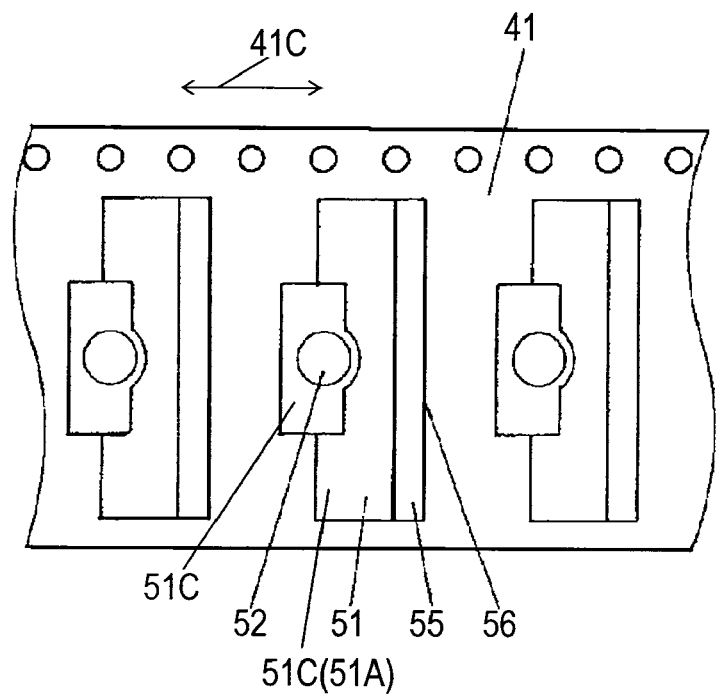
FIG. 4 is a plan view of a career tape of the taped component according to the embodiment.

FIG. 1 is a sectioned view of taped component 1001 according to an exemplary embodiment of the present invention. FIG. 2 is a plan view of taped component 1001. FIG. 4 is a plan view of career tape 41.

Taped component 1001 includes career tape 41 made of plastic. Career tape 41 has plural recesses 51 formed in upper surface 41A at constant intervals along longitudinal direction 41C. Product 20 is stored in each of recesses 51. Cover tape 5 is adhered onto upper surface 41A of career tape 41 to cover and seal respective openings 51B of recesses 51.

Figure 3:
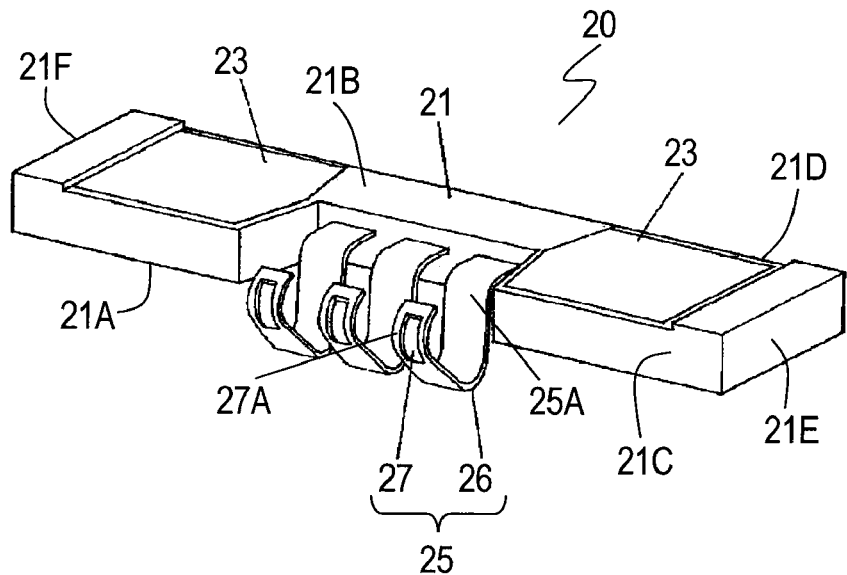
FIG. 3 is a perspective view of a product accommodated in the taped component according to the embodiment.

FIG. 3 is a perspective view of product 20. Product 20 is an electronic component used in various electronic apparatuses, and is a push switch according to this embodiment. Product 20 includes case 21, a push switch element accommodated in each of both sides of case 21, and terminals 25 extending from case 21. Case 21 has substantially a cuboid shape having first outer surface 21A and second outer surface 21B opposite to each other, first side surface 21C and second side surface 21D opposite to each other, and side surfaces 21E and 21F opposite to each other. Side surfaces 21C and 21D are located between outer surfaces 21A and 21B, and connected to surfaces 21A and 21B. Side surfaces 21E and 21F are located between outer surfaces 21A and 21B and connected to surfaces 21A and 21B. Side surfaces 21E and 21F are located between side surfaces 21C and 21D and connected to surfaces 21C and 21D. Flexible insulation films 23 are placed on outer surface 21B of case 21 for activating the push switch elements, respectively. Terminals 25 are connected to the switch elements, and extend from a center area of outer surface 21A of case 21.

Terminal 25 is made of thin metal plate having elasticity. Terminal 25 has base portion 25A protruding from outer surface 21A of case 21, first bent portion 26 extending form base portion 25A forming an acute angle between first bent portion 26 and base portion 25A, and second bent portion 27 extending form first bent portion 26 in a direction different from a direction in which first bent portion 26 extends. Second bent portion 27 has surface 27A facing towards a direction identical to a direction towards which side surface 21C of case 21 faces. Surface 27A is pressed to contact a wiring pattern provided on a wiring board, thereby connecting terminal 25 to the wiring pattern.

As shown in FIG. 1, career tape 41 has auxiliary recess 55 provided in bottom 51C of recess 51. Product 20 is stored in recess 51 while outer surface 21B faces upward direction 1001A toward opening 51B. Bottom 51C of recess 51 has support surface 51A contacting outer surface 21A of product 20 for supporting product 20.

Aperture 52 having a circular shape formed in bottom 51C of recess 51, as shown in FIGS. 1 and 4. Aperture 52 faces position 20B which is apart from center 20A of gravity of product 20 stored in recess 51. Position 20B is located in area 20C between position 20H on outer surface 21A below center 20A of gravity and side surface 21C of case 21, i.e., product 20. According to this embodiment, area 20C includes side surface 21C, and is apart from position 20H below center 20A of gravity, and thus, such does not include center 20A of gravity, i.e., position 20H. Aperture 52 faces first bent portions 26 of terminals 25 of product 20 stored in career tape 41. According to the embodiment, aperture 52 does not face center 20A of gravity of product 20, however, may face center 20A of gravity, i.e., position 20H by appropriately designing the configuration of support surface 51A for supporting product 20. Position 20B is located opposite to side surface 21D with respect to position 20H.

Auxiliary recess 55 is located opposite to position 20B and first bent portions 26 of terminals 25 with respect to center 20A of gravity of product 20, as shown in FIG. 1. Side surface 21D of case 21 of product 20 is located above auxiliary recess 55. Bottom 55A of auxiliary recess 55 has width W1 which is slightly larger than width W2 of side surface 21D of product 20 and which is smaller than width W3 of each of outer surfaces 21A and 21B. Auxiliary recess 55 provided in bottom 51C of recess 51 is connected with wall 56 of recess 51 along wall 56. Auxiliary recess 55 has wall 56A facing wall 56 and is located closer to support surface 51A than wall 56 is. Auxiliary recess 55 has a groove shape having a narrow width. Auxiliary recess 55 flares toward upper surface 41A of career tape 41. That is, wall 56 has a flat shape connected to upper surface 41A of carrier tape 41, and inclines as to remove away from wall 56A and support surface 51A as approaching upper surface 41A of carrier tape 41. Bottom 55A of auxiliary recess 55 is deeper than support surface 51A of bottom 51C of recess 51, and is distanced from upper surface 41A more than support surface 51A is.

A method of mounting product 20 with using taped component 1001 according to this embodiment will be described below.

Figure 5:
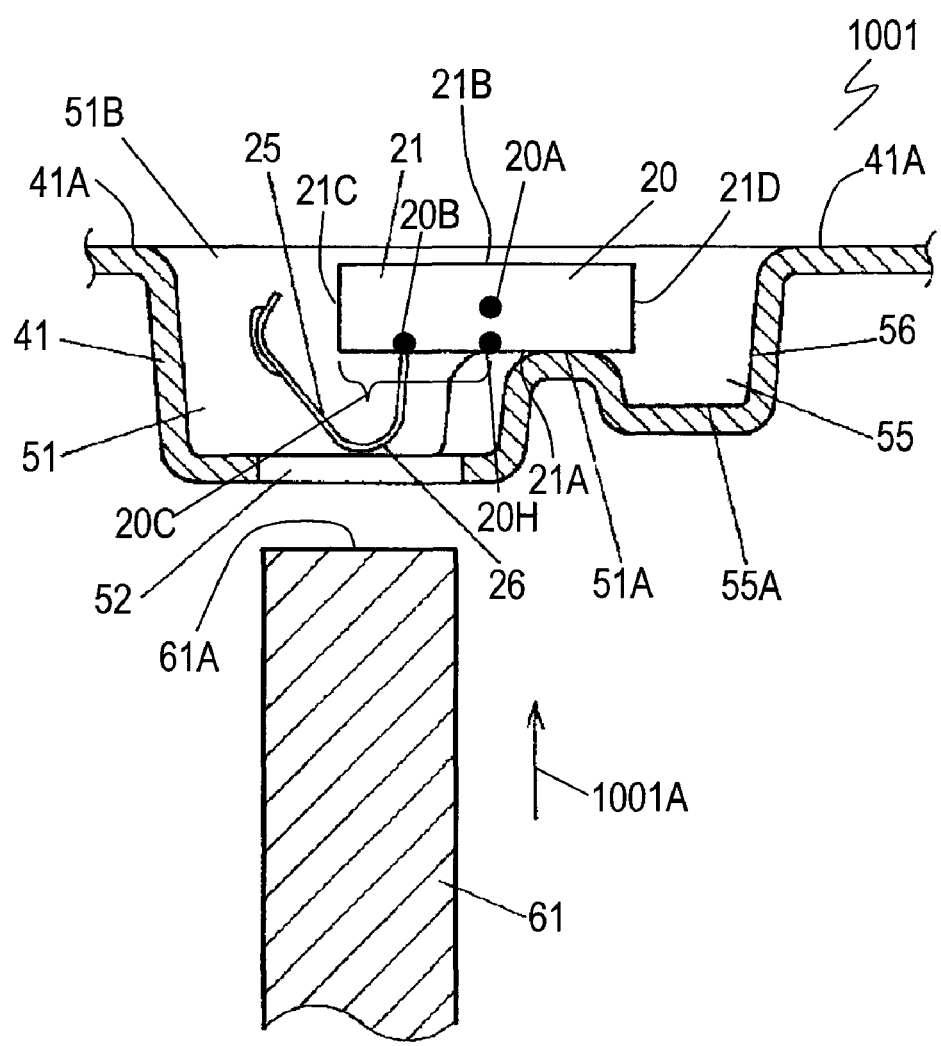
FIGS. 5 and 6 are cross-sectional views of the taped component for illustrating a method of mounting the product contained in the taped component according to the embodiment.

FIG. 5 is a cross-sectional view of product 20 contained in taped component 1001 for illustrating the method of mounting product 20. Cover tape 5 of taped component 1001 is removed from upper surface 41A of career tape 41. FIG. 5 shows taped component 1001 after cover tape 5 is removed from career tape 41. As shown in FIG. 5, pin 61 is inserted into recess 51 from the outside of recess 51 through aperture 52 provided in bottom 51C of recess 51.

Figure 6:
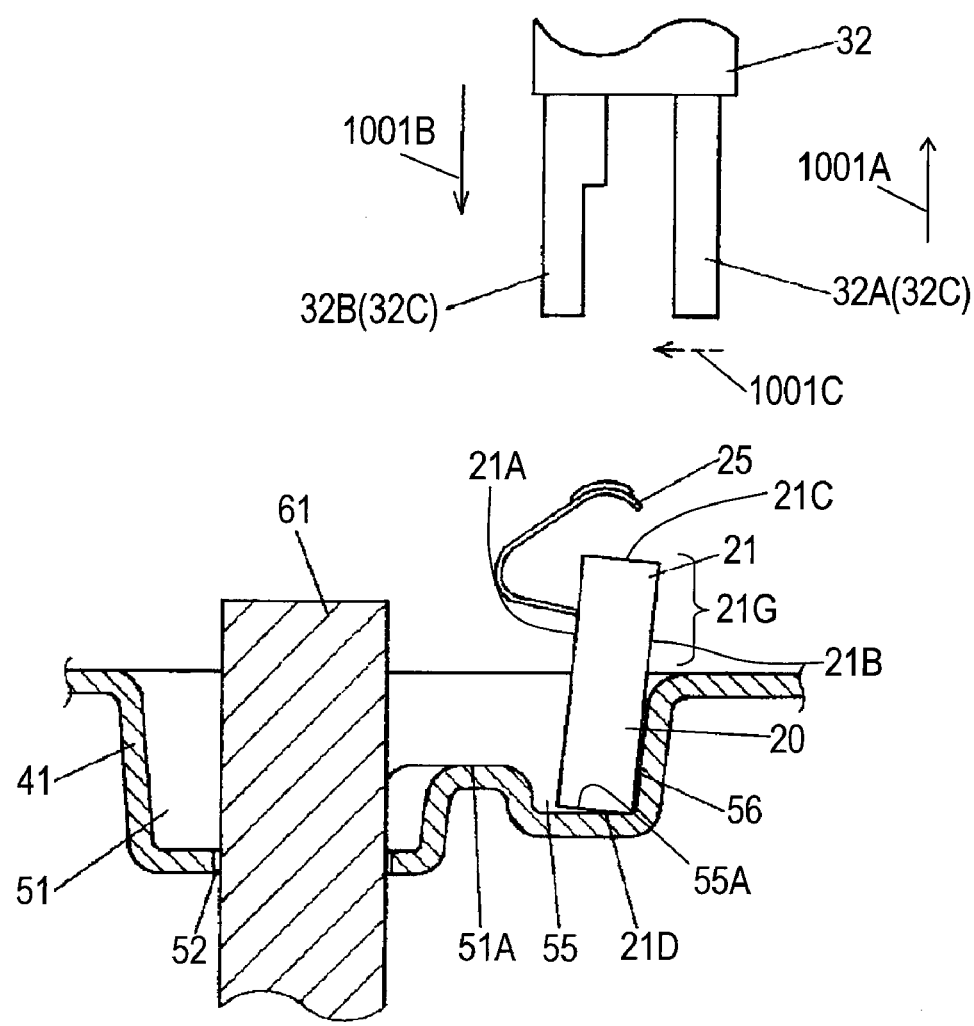

FIG. 6 is a cross-sectional view of mounting product 20 contained in taped component 1001 for illustrating the method of mounting product 20. Upon pin 61 being inserted into recess 51, tip 61A of pin 61 contact first bent portion 26 of terminal 25 and pushes up terminal 25, thereby lifting position 20B of product 20 upward. Position 20B is different from center 20A of gravity of product 20. When position 20B is lifted, product 20 tilts while contacting support surface 51A. Side surface 21D of product 20 is located opposite to position 20B with respect to center 20A of gravity. This arrangement causes product 20, upon tilting further, to drop into auxiliary recess 55 from side surface 21D of case 21. When product 20 drops into auxiliary recess 55, side surface 21D of case 21 contacts bottom 55A of auxiliary recess 55, and side surface 21C opposite to side surface 21D faces upward in direction 1001A, as shown in FIG. 6. At this moment, outer surface 21B of case 21 of product 20 contacts wall 56 of auxiliary recess 55, and thus, product 20 leans against wall 56 to be supported by wall 56.

When product 20 is located in auxiliary recess 55 and leans on wall 56, case 21 has portion 21G protruding above upper surface 41A of career tape 41. Portion 21G of case 21 includes side surface 21C. Retaining chuck 32 moves in downward direction 1001B toward portion 21G of case 21, as shown in FIG. 6. Retaining chuck 32 has retainer 32C consisting of movable section 32A and fixed section 32B that confront each other. Retaining chuck 32 moves downward in direction 1001B to product 20, and movable section 32A moves in direction 1001C toward fixed section 32B so as to hold and retain case 21 between movable section 32A and fixed section 32B. While holding case 21, retaining chuck 32 then takes out product 20 from auxiliary recess 55.

Figure 7:
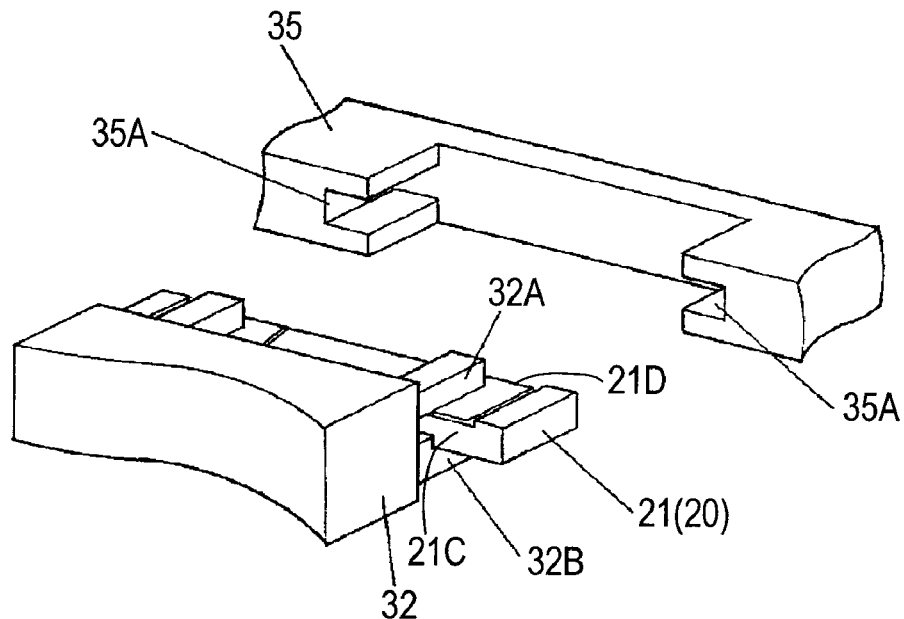
FIGS. 7 and 8 are perspective views of the taped component for illustrating the method of mounting the product contained in the taped component according to the embodiment.
Figure 8:
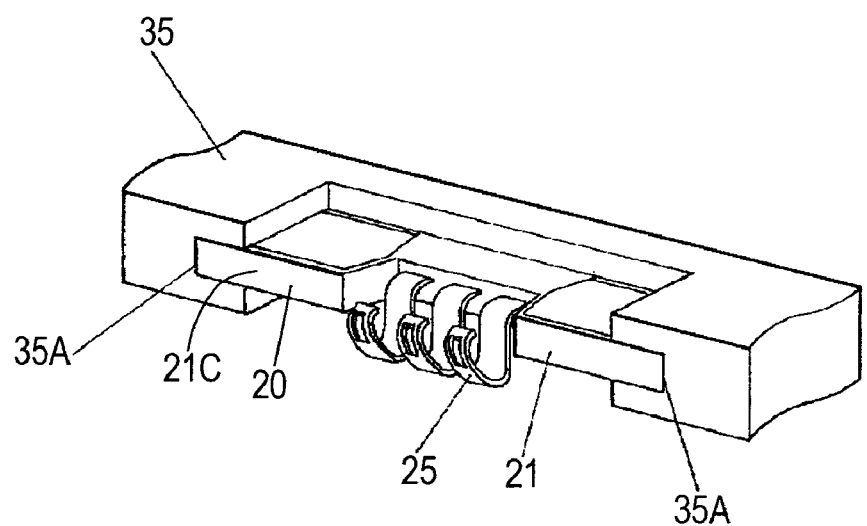

FIGS. 7 and 8 are perspective views of product 20 for illustrating the method of mounting product 20. Mounting tool 35 having engage portions 35A having shapes approximating the shape of case 21 of product 20 is prepared, as shown in FIG. 7. Product 20 retained by retaining chuck 32 is engaged in engage portions 35A of mounting tool 35 from the upper side of case 21. Then, retaining chuck 32 releases product 20. This allows product 20 to be engaged in mounting tool 35, as shown in FIG. 8. Then, mounting tool 35 is positioned and held with a case of an electronic apparatus, and presses product 20 and causes terminal 25 to contact wiring pattern on a wiring board located inside the case of the electronic apparatus, thus mounting product 20 to the electronic apparatus.

Figure 16:
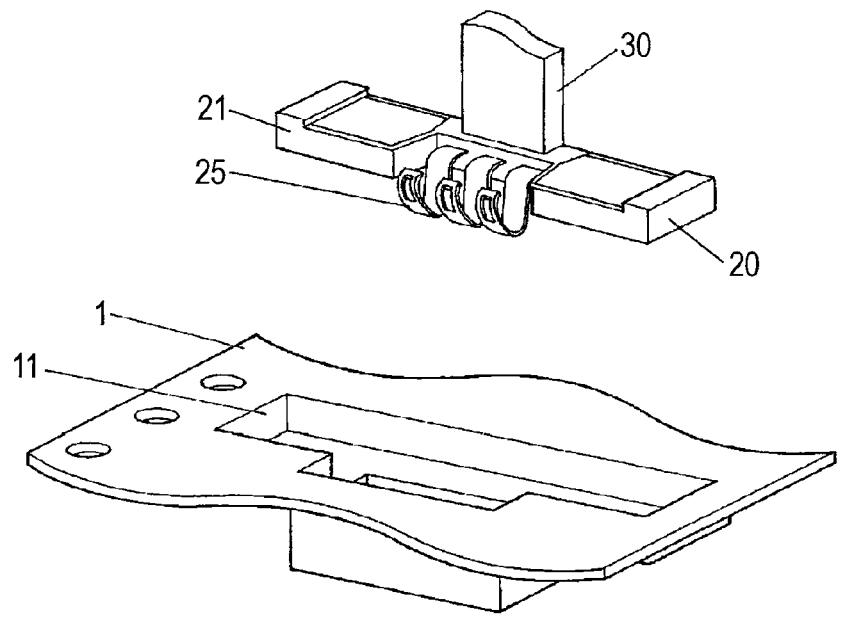
FIG. 16 is a perspective view of the conventional taped component for illustrating a method of mounting the product contained in the conventional taped component.
Figure 17:
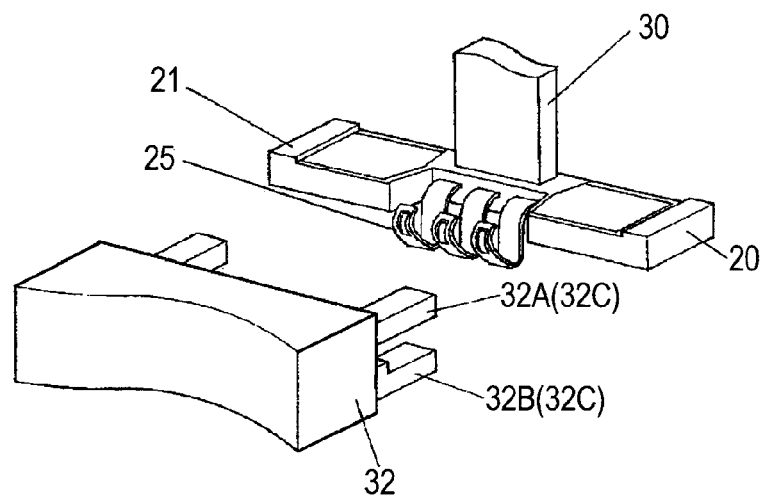
FIG. 17 is a perspective view of the conventional taped component for illustrating the method of mounting the product contained in the conventional taped component.
Figure 18:
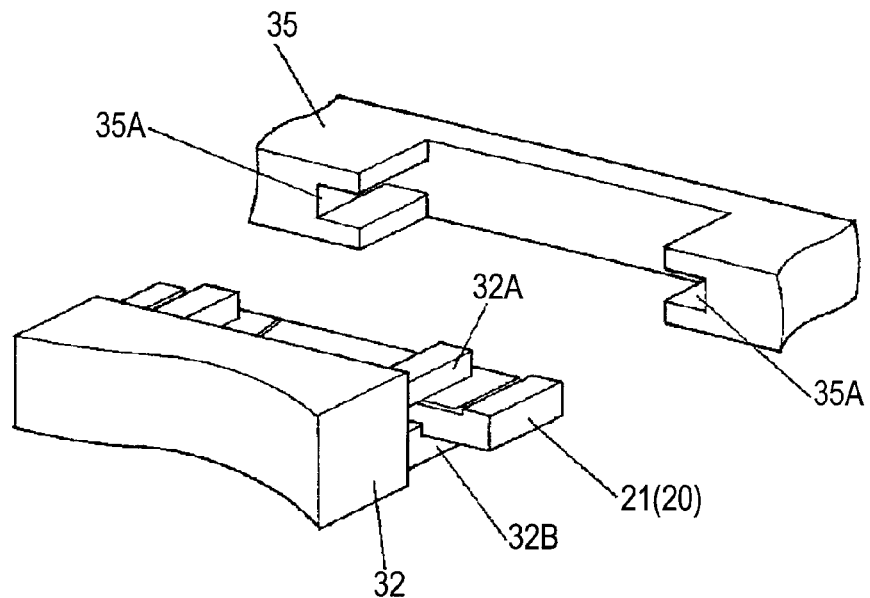
FIG. 18 is a perspective view of the conventional taped component for illustrating the method of mounting the product contained in the conventional taped component.
Figure 19:
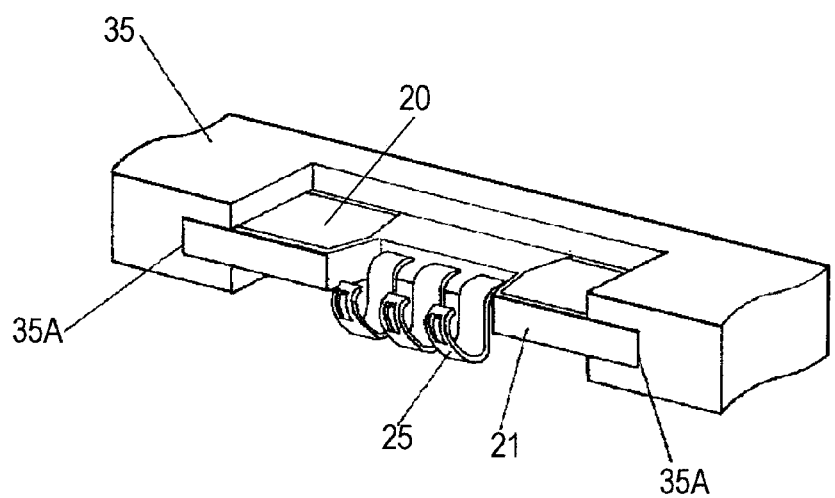
FIG. 19 is a perspective view of the conventional taped component for illustrating the method of mounting the product contained in the conventional taped component.

In the conventional taped component 501 show in FIGS. 16 and 17, product 20 is retained by retaining chuck 32 after being taken out of career tape 1 with suction chuck 30. In taped component 1001 according to this embodiment, product 20 is loaded to mounting tool 35 with retaining chuck 32 by fewer processes without suction chuck 30 for sucking product 20.

Taped component 1001 allows product 20 to drop into auxiliary recess 55 with pin 61 inserted through aperture 52 and to lean against wall 56 to be positioned and supported. Thus, taped component 1001 is useful particularly for thin product 20 having small width W2 of side surface 21D. The shape of pin 61 is not limited as long as being inserted through aperture 52. In the case that product 20 has a shape capable of standing by itself on bottom 55A of auxiliary recess 55 without leaning against wall 56, auxiliary recess 55 may have any shape positioning product 20 dropping in auxiliary recess 55. The shape of wall 56 may be necessarily just the flat surface, but may be analogous to the shape of outer surface 21B of product 20 contacting wall 56.

In taped component 1001 according to this embodiment, terminal 25 do not contact career tape 41 while tilting product 20 is tilting to drop into auxiliary recess 55. Bottom 51C in recess 51 of career tape 41 around aperture 52 is deeper than support surface 51A. This structure may be made by appropriately selecting a thickness and material of career tape 41.

Products 20 contained in taped component 1001 may not necessarily be the push switch, and may be any kind of electronic component, such as a mechanical component, a passive element, or an active element.

Figure 9:
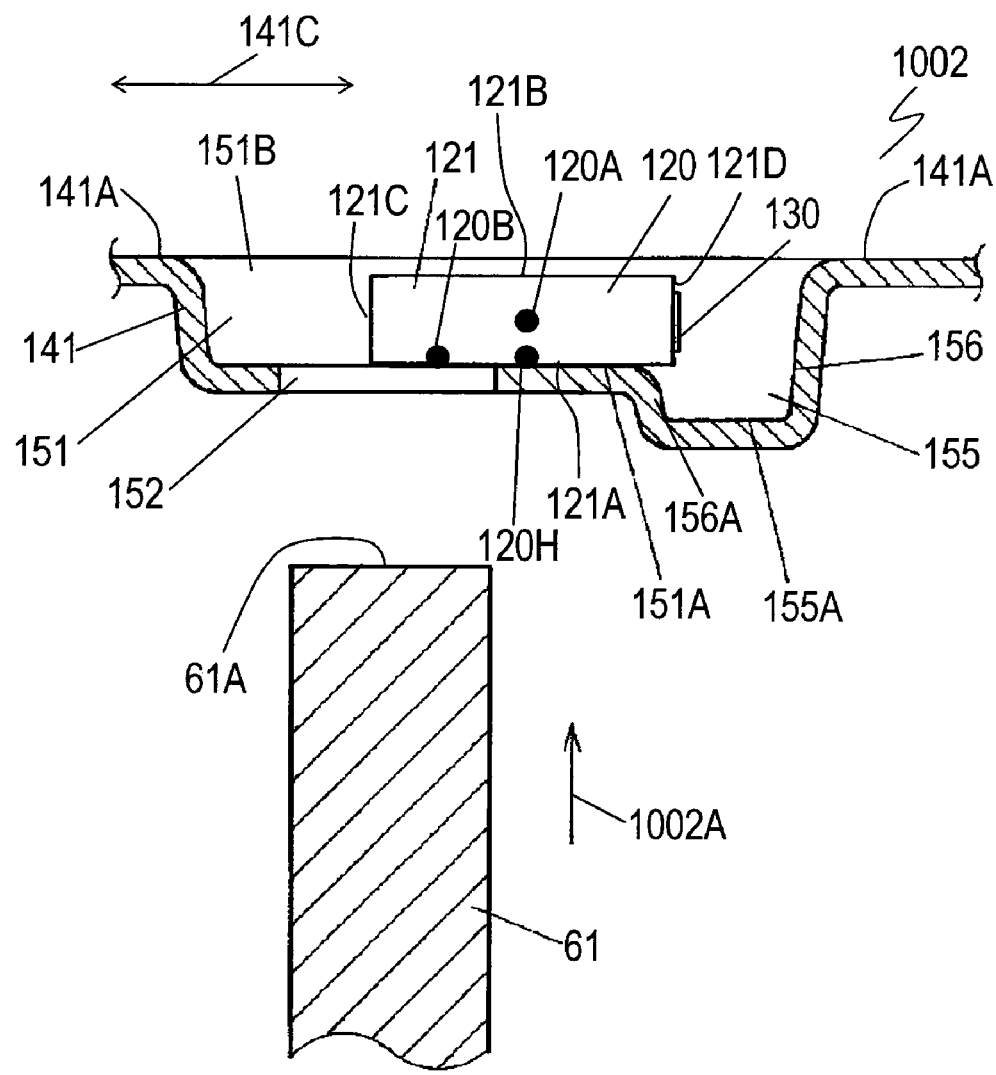
FIGS. 9 and 10 are cross-sectional views of another taped component for illustrating a method of mounting a product contained in the taped component according to the embodiment.
Figure 10:
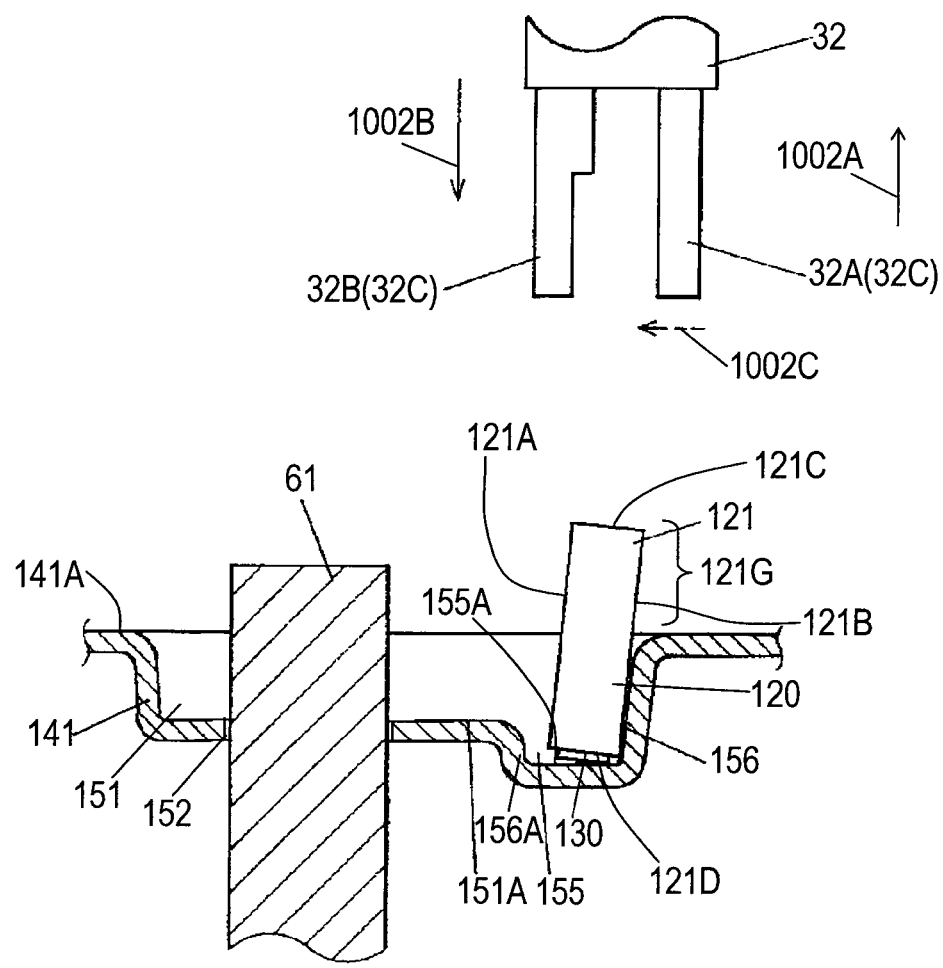
Figure 11:
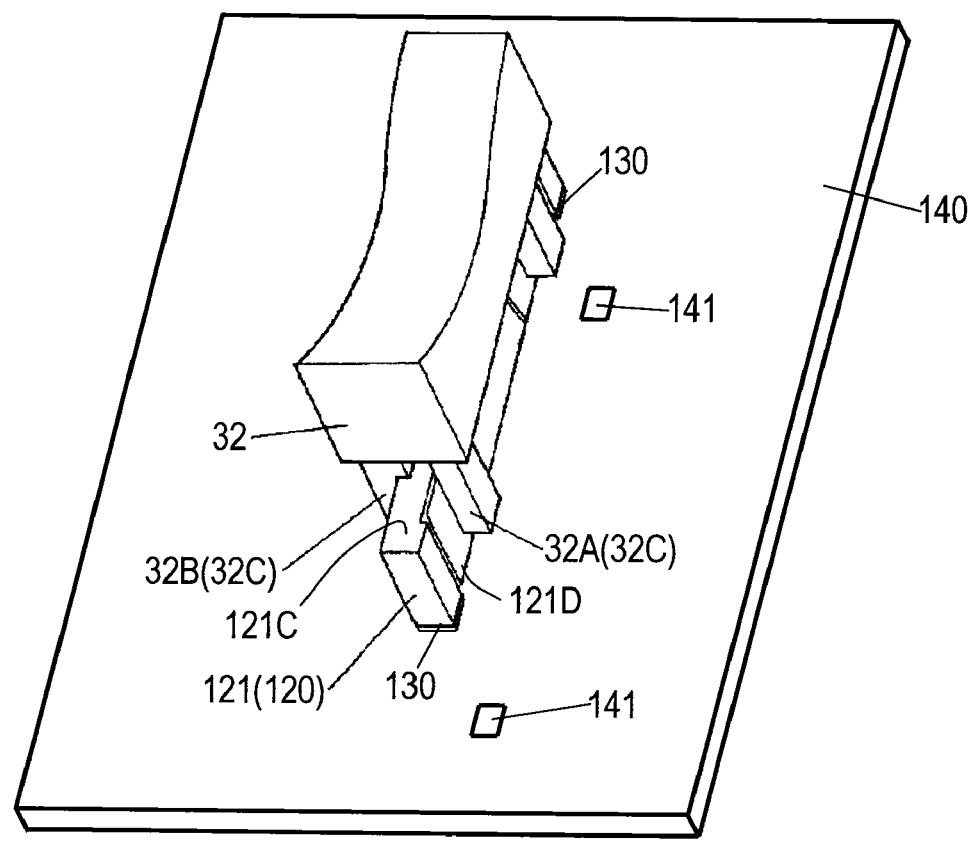
FIG. 11 is a perspective view of another taped component for illustrating the method of mounting the product contained in the taped component according to the embodiment.
Figure 12:
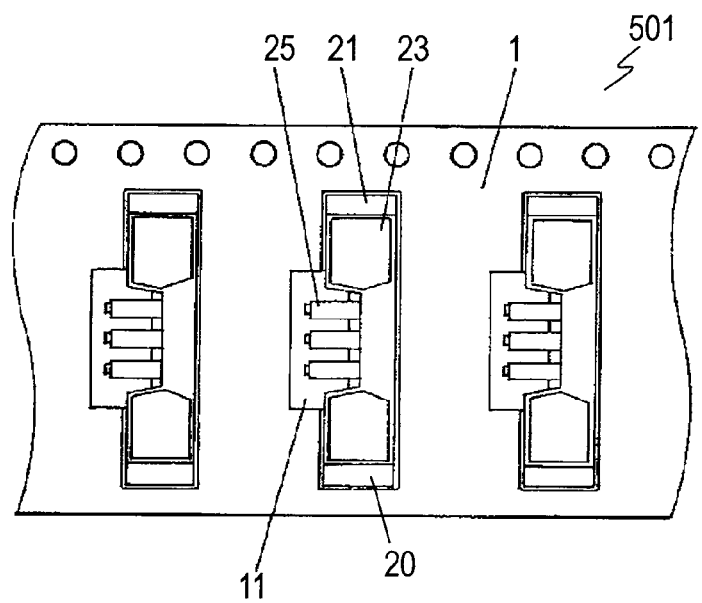
FIG. 12 is a plan view of a conventional taped component.
Figure 13:
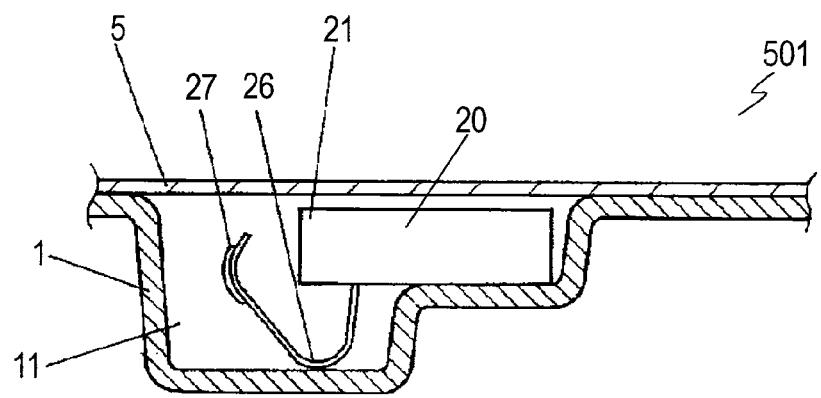
FIG. 13 is a sectioned view of the conventional taped component.
Figure 14:
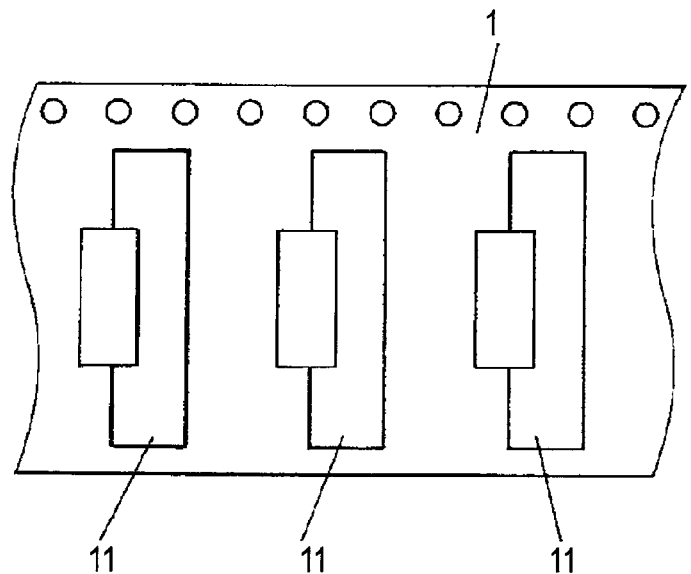
FIG. 14 is a plan view of a career tape of the conventional taped component.
Figure 15:
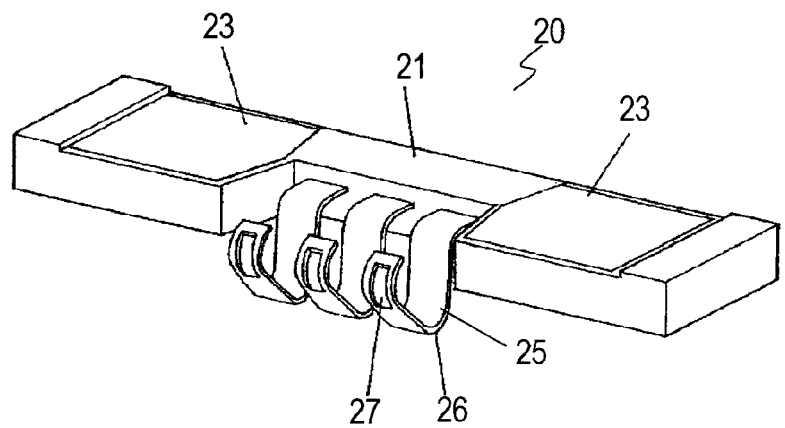
FIG. 15 is a perspective view of a product contained in the conventional taped component.

FIGS. 9 to 11 are perspective views of mounting product 120 contained in another taped component 1002 according to this embodiment for illustrating a method of mounting product 120. In FIGS. 9 to 11, Components identical to those of taped component 1001 shown in FIGS. 1 to 8 are denoted by the same reference numerals, and their description will be omitted. Taped component 1002 includes products 120 and career tape 141 instead of products 20 and career tape 41 of taped component 1001 shown in FIGS. 1 to 8. Career tape 141 has plural recesses 151 formed in upper surface 141A thereof at constant intervals along longitudinal direction 141C. Recess 151 has opening 151B opening to upper surface 141A. Product 120 is stored in each of recesses 151. Product 120 includes case 121 having a substantially cuboid shape similar to that of product 20 shown in FIG. 3. Case 121 has outer surfaces 121A and 121B and side surfaces 121C to 121F which are positioned at the same positions as outer surfaces 21A and 21B and side surfaces 21C to 21F of case 21 of product 20 shown in FIG. 3, respectively. In other words, case 121 has substantially a cuboid shape, and has first outer surface 121A and second outer surface 121B opposite to each other, first side surface 121C and second side surface 121D opposite to each other, and side surfaces 121E and 121F opposite to each other. Side surfaces 121C and 121D are located between outer surfaces 121A and 121B, and are connected to surfaces 121A and 121B. Side surfaces 121E and 121F are located between outer surfaces 121A and 121B, are connected to surfaces 121A and 121B. Side surfaces 121E and 121F are located between side surfaces 121C and 121D and are connected to surfaces 121C and 121D. Terminals 130 are provided on side surface 121D of case 121. Product 120 has center 120A of gravity.

Career tape 141 has auxiliary recess 155 provided in bottom 151C of recess 151, as shown in FIG. 9. Product 120 is stored in recess 151 while outer surface 121B faces upward in direction 1002A toward opening 151B. Bottom 151C of recess 151 includes support surface 151A arranged to contact outer surface 121A of product 120 for supporting product 120.

As shown in FIG. 9, aperture 152 faces position 120B which is different from center 120A of gravity of product 120 stored in recess 151. Position 120B is located in area 120C between center 120A of gravity and side surface 121C of case 121, i.e., product 120. Area 120C includes side surface 121C and is apart from position 120H below center 120A of gravity, and thus, area 120C does not include center 120A of gravity, i.e., position 120H. In taped component 1002 shown in FIG. 9, aperture 152 does not face center 120A of gravity of product 120. However, aperture 152 may face center 120A of gravity by appropriately designing the configuration of support surface 151A for supporting product 120.

Auxiliary recess 155 is located opposite to position 120B with respect to center 120A of gravity of product 120, as shown in FIG. 9. Side surface 121D of case 121 of product 120 is located above auxiliary recess 155. Bottom 155A of auxiliary recess 155 has width W101 which is slightly larger than width W102 of side surface 121D of product 120 and which is smaller than width W103 of each of outer surfaces 121A and 121B. Auxiliary recess 155 provided in bottom 151C of recess 151 is connected with wall 156 of recess 151 along wall 156. Auxiliary recess 155 has wall 156A facing wall 156 and is located closer to support surface 151A than wall 156 is. Auxiliary recess 155 has a groove shape having a narrow width. Auxiliary recess 155 flares toward upper surface 141A of career tape 141. That is, wall 156 has a flat shape connected to upper surface 141A of carrier tape 141, and inclines as to remove away from wall 156A and support surface 151A as approaching upper surface 141A of carrier tape 141. Bottom 155A of auxiliary recess 155 is deeper than support surface 151A of bottom 151C of recess 151, and is distanced from upper surface 141A more than support surface 151A is.

As shown in FIG. 9, cover tape 5 of taped component 1002 is removed from upper surface 141A of career tape 141. FIG.

9 shows taped component 1002 after cover tape 5 is removed from career tape 141. Pin 61 is inserted into recess 151 from the outside of recess 151 through aperture 152 provided in bottom 151C of recess 151, as shown in FIG. 9.

Upon pin 61 being inserted into recess 151, tip 61A of pin 61 contacts position 120B of product 120 and pushes up position 120B of product 120. Position 120B is different from center 120A of gravity of product 120. When position 120B is lifted, product 120 tilts while contacting support surface 151A. Side surface 121D of product 120 is located opposite to position 120B with respect to center 120A of gravity. This arrangement allows product 120, upon tilting further, to drop into auxiliary recess 155 from side surface 121D of case 121. When product 120 drops in auxiliary recess 155, side surface 121D of case 121 contacts bottom 155A of auxiliary recess 155, and side surface 121C opposite to side surface 121D faces towards upward in direction 1002A, as shown in FIG. 10. At this moment, outer surface 121B of case 121 of product 120 contacts wall 156 of auxiliary recess 155, such that product 120 leans against wall 156. Terminals 130 contacts bottom 155A of auxiliary recess 155 at this moment.

When product 120 is located in auxiliary recess 155 and leans on wall 156, case 121 has portion 421G protruding above upper surface 141A of career tape 141. Portion 121G of case 121 includes side surface 121C. Retaining chuck 32 moves in downward direction 1002B toward portion 121G of case 121, as shown in FIG. 10. Retaining chuck 32 has retainer 32C consisting of movable section 32A and fixed section 32B that confront each other. Retaining chuck 32 moves downward in direction 1002B to product 120, and movable section 32A moves in direction 1002C toward fixed section 32B so as to hold and retain case 121 between movable section 32A and fixed section 32B. While holding case 121, retaining chuck 32 then takes out product 120 from auxiliary recess 155.

While retaining chuck 32 retains product 120, side surface 121D of case 121 of product 120 is located opposite to retaining chuck 32, and thus, terminal 130 is located opposite to retaining chuck 32, as shown in FIG. 11. Retaining chuck 32 dips terminal 130 into a solder bath and applies solder on terminal 130 while holding case 121 with side surface 121D faces downward. Then, chuck 32 moves product 120 downward to connect terminal 130 with conductor land 141 on wiring board 140 with the solder. In taped component 1002, product 120 is mounted onto board 140 with retaining chuck 32 by fewer processes without suction chuck 30 necessary for the conventional taped component 501 show in FIGS. 16 and 17.

According to this embodiment, products 20 and 120 are mounted efficiently since products 20 and 120 are taken out from the career tapes 41 and 141 of taped components 1001 and 1002 without changing chucks, respectively.

What is claimed is:

1. A taped component comprising:
   a carrier tape having an upper surface having a plurality of recesses provided therein; and
   a plurality of products stored in the plurality of recesses, respectively, each of the plurality of products having a center of gravity,
   wherein each of the plurality of recesses includes a main recess, an auxiliary recess, and a support surface protruding from both the bottom of the main recess and the bottom of the auxiliary recess between the main recess and the auxiliary recess to separate the main recess from the auxiliary recess,
   wherein the main recess has an aperture provided at the bottom of the main recess, and
   wherein each of the products is placed on the support surface at such a position that a perpendicular line passing through the center of gravity is located outside of the aperture and between an outer perimeter of the aperture and the support surface.

2. The taped component of claim 1, wherein each of the plurality of products has a first outer surface contacting the support surface of each of plurality of recesses, a second outer surface opposite to the first outer surface, a first side surface connected to the first outer surface and the second outer surface, and a second side surface being opposite side of the first side surface and being connected to the first outer surface and the second outer surface
   wherein the auxiliary recess has a first wall extended from the support surface to the bottom of the auxiliary recess and a second wall facing the first wall.

3. The taped component of claim 2,
   wherein the main recess, the support surface, and the auxiliary recess are arranged in a longitudinal direction of movement of the carrier tape, and
   wherein a width (W1) of the auxiliary recess in the longitudinal direction is larger than a length (W2) of the second side surface between the first outer surface and the second outer surface and smaller than a width (W3) of the first outer surface of each of the plurality of products in the longitudinal direction.

4. The taped component of claim 2, wherein each of the plurality of products is arranged such that, when a pin is inserted into the aperture and pushes the first outer surface of each of the plurality of products, each of the plurality of products enters into the auxiliary recess while the second side surface of each of the plurality of products contacts the bottom of the auxiliary recess, and the second outer surface of each of the plurality of products contacts the second wall.

5. The taped component of claim 1, further comprising a cover tape adhered to the carrier tape for sealing the plurality of recesses.

6. The taped component of claim 1, wherein the carrier tape extends in a longitudinal direction, and the plurality of recesses are arranged at constant intervals along the longitudinal direction.

* * * * *